United States Patent [19]

Guillien

[11] 4,254,380

[45] Mar. 3, 1981

[54] BRIDGE AMPLIFIER

[75] Inventor: Michel Y. Guillien, Gex, France

[73] Assignee: Motorola, Inc., Schaumburg, Ill.

[21] Appl. No.: 54,193

[22] Filed: Jul. 2, 1979

[51] Int. Cl.³ .............................................. H03F 3/26
[52] U.S. Cl. ...................................... 330/275; 330/84;
330/273; 330/146
[58] Field of Search ................ 330/275, 272, 273, 84, 330/146, 117

[56] References Cited

U.S. PATENT DOCUMENTS

| 2,951,208 | 8/1960 | Barton | 330/273 |
| 3,212,019 | 10/1965 | Schwartz | 330/275 |
| 3,990,020 | 11/1976 | Porter | 330/146 |
| 4,088,961 | 5/1978 | Ashley | 330/84 |
| 4,180,781 | 12/1979 | Kaplan | 330/272 |

*Primary Examiner*—Harold A. Dixon
*Attorney, Agent, or Firm*—Michael D. Bingham

[57] ABSTRACT

A circuit for converting an asymmetrical input signal applied to a single ended input terminal of the circuit to a symmetrical output voltage appearing across balanced differential outputs. The circuit includes first and second operational amplifiers, the outputs of which are the outputs of the circuit. The noninverting inputs of the two amplifiers being coupled to a reference voltage. The inverting input of the first amplifier being adapted to receive the input signal and further being coupled through a first resistor to the output thereof. The inverting input of the second amplifier being coupled both to the output thereof and the output of the first amplifier through respective second and third resistors.

5 Claims, 1 Drawing Figure

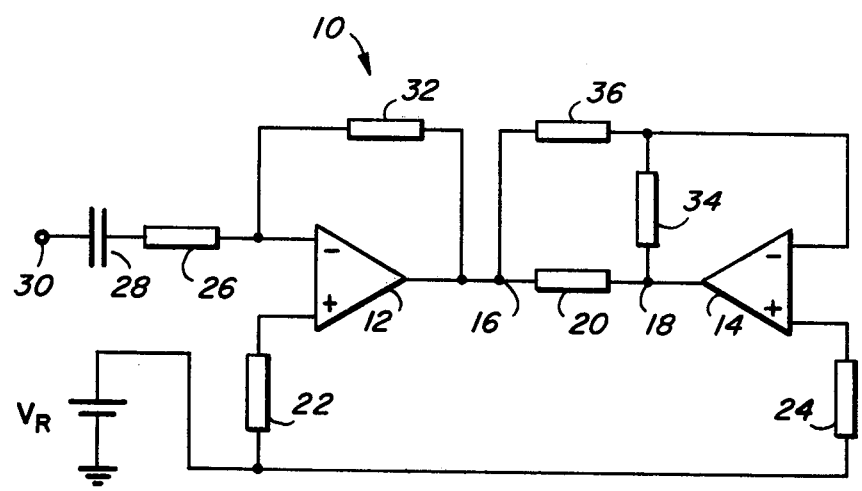

BRIDGE AMPLIFIER

BACKGROUND OF THE INVENTION

1. Field of the Invention

This invention relates to audio amplifier circuits and more particularly to bridge amplifier circuits.

2. Description of the Prior Art

Audio bridge amplifiers are well known in the art. Most, if not all, of the contemporary bridge amplifiers are comprised of at least two operational amplifiers using coupling capacitors and some direct current adjustment circuitry for adjusting and matching components to reduce the output offset voltage of the amplifier. It is desirous to reduce the output voltage offset in order to reduce the power consumption of the bridge amplifier. It is also desired to produce the bridge amplifier in monolithic integrated circuit form to maximize circuit efficiency and to reduce production costs.

Because many prior art bridge amplifiers require large capacitors and other external circuits for adjustments, the cost of these external components offset any practical savings which may result by fabricating the amplifier in monolithic form. Thus, a need exists to reduce or eliminate as many required external components as possible while maintaining the output offset voltage to a minimal level.

SUMMARY OF THE INVENTION

Accordingly, it is an object of the present invention to provide an improved bridge amplifier.

It is another object of the present invention to provide a monolithic bridge amplifier circuit having a minimal output offset voltage.

It is an additional object of the present invention to provide monolithic bridge amplifier circuit requiring few, if any, external components for operation while simultaneously producing a minimal offset voltage at the output thereof.

In accordance with the foregoing and other objects there is provided a bridge amplifier comprising a pair of operational amplifiers. The noninverting inputs of the two amplifiers being coupled to a reference voltage and their outputs being the outputs of the bridge amplifier. The inverting input of the first amplifier being the input of the bridge amplifier and being coupled via a resistor to its output. The inverting input of the second amplifier being coupled through a first and second resistor respectively to its output and to the output of the first amplifier such that the direct current (dc) level of the output voltage developed between the outputs of these two amplifiers is minimal.

BRIEF DESCRIPTION OF THE DRAWING

The single FIGURE is a partial block and schematic diagram of the preferred embodiment of the invention.

DETAILED DESCRIPTION OF THE INVENTION

The preferred embodiment of the invention is shown in the single FIGURE. Bridge amplifier 10 is illustrated as inlcuding two operational amplifiers 12 and 14 having outputs coupled respectively to output terminals 16 and 18. A load 20 is shown coupled between the output terminals 16 and 18 of the bridge amplifier circuit. The inverting inputs of operational amplifiers 12 and 14 are coupled to a reference source voltage VR through resistors 22 and 24 respectively. The inverting input of operational amplifier 12 is coupled through resistor 26 and direct current (d.c.) blocking capacitor 28 to input terminal 30 at which is provided an input signal to the circuit. It is understood that bridge amplifier 10 is suited for fabrication in monolithic integrated circuit form. Hence, capacitor 28 may or may not be included in the integrated chip. A gain setting resistor 32 is coupled between the output and the inverting input of operational amplifier 12. The inverting input of operational amplifier 14 is connected at a common junction to one terminal of each of the resistors 34 and 36. The other terminal of resistor 34 is returned to output terminal 18 and the other terminal of resistor 36 is returned to output terminal 16.

In operation, bridge amplifier 10 converts an asymmetrical input signal applied at input terminal 30 into a symmetrical output voltage applied to load 20. In a quiescent operating state only a very small output offset voltage is generated across the load (generally less than or equal to 20 mV across a 4 ohm load). In a preferred embodiment load 20 may be a speaker.

Direct Current Operation

As illustrated, the noninverting inputs of amplifiers 12 and 14 are each connected to reference voltage VR. Ideally, since almost no current flows into these inputs of the amplifiers, VR can be derived from a single power supply through a simple resistor bridge.

Neglecting input current to amplifier 12, it can be shown that the output voltage appearing at the output of this amplifier, at terminal 16, is equal to VR (neglecting the voltage offset of the amplifier). Similarly, it can be shown that the output voltage of amplifier 14 which appears at terminal 18 is nearly equal to VR. Thus, the voltages appearing at respective output terminals 16 and 18 are substantially equal in the d.c. quiescent state.

In practice, however, a small offset voltage appears across the load 20. This offset voltage is caused by the input offset currents and voltages of amplifiers 12 and 14. This output offset voltage can be determined and is equal to:

$$V_{offset} = R34 I'14 + (1 + [R34/R36])(R\text{-}32 I'12 + V'12 + V'14) \quad (1)$$

provided:

$$R24 = (R34\,R36)/(R34 + R36) \text{ and } R22 = R32$$

Where:
- $I'12$ is the offset current of amplifier 12
- $V'12$ is the offset voltage of amplifier 12
- $I'14$ is the offset current of amplifier 14
- $V'14$ is the offset voltage of amplifier 14

By matching the characteristics of amplifiers 12 and 14 and maintaining close tolerance on the resistor values through the use of integrated circuit technology the d.c. offset voltage can be maintained at a few millivolts which in many cases is an acceptable level. In the preferred embodiment, the magnitude of VR is chosen to lie in the middle of the output range of the two amplifiers so that there is minimum distortion in the system.

ALTERNATING CURRENT CIRCUIT ANALYSIS

As understood, in response to an applied voltage Vin, the output voltage of amplifier 12 is equal to:

$$v_{out} = -v_{in}(R32/R26) \quad (2)$$

Since no alternating current (a.c.) component is applied to the noninverting input of amplifier 14, and considering the gain of this amplifier to be infinite, the output voltage appearing at terminal 18 can be shown to be nearly equal to:

$$v_{out}(\text{at terminal 18}) = -v_{out}(R34/R36) \quad (3)$$

Thus, the output voltage appearing across the load is:

$$v_{out} = -v_{in}R32/R26(1+[R34/R36]) \quad (4)$$

If the outputs of both amplifiers 12 and 14 have the same excursion range, and R36 made equal to R34;

$$v_{out} = -2(R32/R26)v_{in} \quad (5)$$

A bridge amplifier circuit has been described above having minimal direct voltage offset. The circuit provides maximum gain utilizing a single power supply and is suitable to be fabricated in monolithic integrated form.

I claim:

1. A bridge amplifier, comprising:
   first and second operational amplifiers, each having an inverting input, a noninverting input and an output, the noninverting input of each one of said first and second operational amplifier being coupled to a terminal at which is supplied a direct current reference voltage said respective outputs being the outputs of the bridge amplifier;
   first circuit means for coupling the inverting input of said first operational amplifier to an input of the bridge amplifier;
   first resistive means for coupling the inverting input of said first operational amplifier to the output thereof; and
   second resistive means for coupling the inverting input of said second operational amplifier both to the output thereof and to said output of said first operational amplifier, said noninverting inputs of said first and second operational amplifiers being direct current isolated from said inverting inputs and said outputs thereof.

2. The bridge amplifier of claim 1 wherein said first resistive means is a first resistor having a first value.

3. The bridge amplifier of claim 2 wherein said second resistive means includes:
   a second resistor having a second value being connected between said inverting input of said second operational amplifier and the output thereof; and
   a third resistor having a third value being connected between said inverting input of said second operational amplifier and said output of said first operational amplifier.

4. The bridge amplifier of claim 3 wherein said values of said second and third resistors are equal in magnitude.

5. The bridge amplifier of claim 4 including:
   a fourth resistor connecting said noninverting input of said first operational amplifier to said terminal at which is supplied a reference voltage; and
   a fifth resistor connecting said noninverting input of said second amplifier to said terminal at which is supplied a reference voltage.

* * * * *